(12) United States Patent
Santos et al.

(10) Patent No.: US 9,239,346 B2
(45) Date of Patent: Jan. 19, 2016

(54) SYSTEMS FOR PROVIDING ELECTRO-MECHANICAL SENSORS

(71) Applicant: THE REGENTS OF THE UNIVERSITY OF CALIFORNIA, Oakland, CA (US)

(72) Inventors: Veronica J. Santos, Tempe, AZ (US); Jonathan Posner, Seattle, WA (US); Ruben Ponce Wong, Tempe, AZ (US)

(73) Assignee: THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 72 days.

(21) Appl. No.: 13/752,286

(22) Filed: Jan. 28, 2013

(65) Prior Publication Data

US 2013/0271159 A1   Oct. 17, 2013

Related U.S. Application Data

(60) Provisional application No. 61/591,881, filed on Jan. 28, 2012.

(51) Int. Cl.
*G01R 27/26* (2006.01)
*G01D 5/241* (2006.01)
*G01L 25/00* (2006.01)
*G01L 1/14* (2006.01)

(52) U.S. Cl.
CPC .......... *G01R 27/2605* (2013.01); *G01D 5/2417* (2013.01); *G01L 1/146* (2013.01); *G01L 25/00* (2013.01)

(58) Field of Classification Search
CPC ...................... A61F 2250/0058; B25J 15/0023
USPC .................. 324/661, 658, 686; 345/174, 175; 73/1.15, 862.045, 724, 514.32, 73/862.381, 862.581, 862.626; 700/258, 700/260, 254
See application file for complete search history.

(56) References Cited

U.S. PATENT DOCUMENTS

| | | | |
|---|---|---|---|
| 6,586,943 B1 * | 7/2003 | Masuda et al. | 324/500 |
| 6,769,313 B2 | 8/2004 | Weiss | |
| 7,481,120 B2 | 1/2009 | Gravesen et al. | |
| 7,679,376 B2 * | 3/2010 | Kang et al. | 324/658 |
| 8,598,893 B2 * | 12/2013 | Camus | 324/661 |
| 8,653,837 B2 * | 2/2014 | Frangen | 324/681 |

(Continued)

OTHER PUBLICATIONS

Adrega, T., et al., "Stretchable gold conductors embedded in PDMS and patterned by photolithography: fabrication and electromechanical characterization", In Journal of Micromechanics and Microengineering, vol. 20, No. 5, Apr. 23, 2010, pp. 1-8.

(Continued)

*Primary Examiner* — Benjamin M Baldridge
*Assistant Examiner* — Nasima Monsur
(74) *Attorney, Agent, or Firm* — John P. O'Banion; Matthew T. Byrne

(57) ABSTRACT

Systems for providing electro-mechanical sensors are provided. In some embodiments, a system for providing an electro-mechanical sensor comprising: a flexible material forming at least a first channel and a second channel, wherein the first channel includes a first plate region and the second channel forms a second plate region that is substantially aligned with the first plate region; and an electrically conductive fluid that fills the first channel and the second channel.

20 Claims, 13 Drawing Sheets

(56) References Cited

U.S. PATENT DOCUMENTS

| | | | |
|---|---|---|---|
| 2006/0267140 A1 | 11/2006 | Lee et al. | |
| 2007/0227267 A1 | 10/2007 | Loeb et al. | |
| 2009/0133508 A1 | 5/2009 | Johansson et al. | |
| 2010/0072565 A1* | 3/2010 | Liu et al. | 257/417 |
| 2010/0103137 A1* | 4/2010 | Ciesla et al. | 345/174 |
| 2010/0201650 A1* | 8/2010 | Son | 345/174 |
| 2010/0308846 A1* | 12/2010 | Camus | 324/679 |
| 2011/0050256 A1* | 3/2011 | Frangen | 324/681 |
| 2012/0242607 A1* | 9/2012 | Ciesla et al. | 345/173 |
| 2014/0071584 A1* | 3/2014 | Rofougaran | 361/284 |

OTHER PUBLICATIONS

Charitidis, C., "Nanoscale Deformation and Nanomechanical Properties of Soft Matter Study Cases: Polydimethylsiloxane, Cells and Tissues," In ISRN Nanotechnology, vol. 2011, May 2011, pp. 1-13.
Cheng, M.Y., et al., "The Development of a Highly Twistable Tactile Sensing Array with Stretchable Helical Electrodes", In Sensors and Actuators A, vol. 166, Apr. 2011, pp. 226-233.
Da Silva, M.J., et al., "Capacitance wire-mesh sensor for fast measurement of phase fraction distributions", In Measurement Science and Technology, vol. 18, No. 7, Jul. 2007, pp. 2245-2251.
Dahiya, R.S., et al., "Tactile Sensing—From Humans to Humanoids", In IEEE Transactions on Robotics, vol. 26, No. 1, Feb. 2010, pp. 1-20.
Engel, J.M., et al., "Multi-layer embedment of conductive and non-conductive PDMS for all-elastomer MEMS", In Solid State Sensors, Actuators, and Microsystems Workshop (Hilton Head '06), Hilton Head Island, SC, Jun. 4-8, 2006, pp. 316-319.
Feng, J.T., et al., "Influence of different amount of Au on the wetting behavior of PDMS membrane", In Biomed Microdevices, vol. 10, Feb. 2008, pp. 65-72.
Fuard, D., et al., "Optimization of poly-di-methyl-siloxane (PDMS) substrates for studying cellular adhesion and motility", In Microelectronic Engineering, vol. 85, May-Jun. 2008, pp. 1289-1293.
Goyal, A., et al., "In situ Synthesis of Metal Nanoparticle Embedded Free Standing Multifunctional PDMS Films", In Macromolecular Rapid Communications, vol. 30, Jul. 1, 2009, pp. 1116-1122.
Gray, B.L., et al., "A Surface Micromachined Microtactile Sensor Array", In Proceedings of the Apr. 1996 IEEE International Conference on Robotics and Automation (ICRA '96), Minneapolis, MN, Apr. 22-28, 1996, pp. 1-6.
Hu, H., et al., "Super flexible sensor skin using liquid metal as interconnect", In IEEE Sensors 2007 conference, Atlanta, GA, Oct. 28-31, 2007, pp. 815-817.
Jo, B.H., et al., "Three-Dimensional Micro-Channel Fabrication in Polydimethylsiloxane (PDMS) Elastomer", In Journal of Microelectromechanical Systems, vol. 9, No. 1, Mar. 2000, pp. 76-81.
Khanafer, K., et al., "Effects of strain rate, mixing ratio, and stress—strain definition on the mechanical behavior of the polydimethylsiloxane (PDMS) material as related to its biological applications", In Biomed Microdevices vol. 11, Apr. 2009, pp. 503-508.
Kim, D.H., et al., "Materials and noncoplanar mesh designs for integrated circuits with linear elastic responses to extreme mechanical deformations", In Proceedings of the National Academy of Sciences. vol. 105, No. 28, Dec. 2, 2008, pp. 18675-18680.
Kim, H.J., et al., "A multiaxial stretchable interconnect using liquid-alloy-filled elastomeric microchannels", In Applied Physics Letters, vol. 92, No. 1, Jan. 2008, pp. 011904-011904-3.
Kim, K.H, et al., "Proofmass-Less Vibration Sensor using the Motion of Self-Charged Anion and Cation in an Electrolyte for Ultra-High Frequency Detection", In IEEE 21st International Conference on Micro Electro Mechanical Systems (MEMS '08), Tucson, AZ, Jan. 13-17, 2008, pp. 94-97.
Koterba, S., et al., "A triaxial force discernment algorithm for flexible, high density, artificial skin", In Proceedings of the 2006 IEEE International Conference on Robotics and Automation (ICRA '06), May 15-19, 2006, pp. 1359-1364.
Kramer, R.K., et al., "Soft Curvature Sensors for Joint Angle Proprioception", In Proceedings of the IEEE/RSJ International Conference on Intelligent Robots and Systems (IROS '11), San Francisco, CA, USA, Sep. 25-30, 2011, pp. 1919-1926.
Lee, H.K., et al., "Normal and Shear Force Measurement Using a Flexible Polymer Tactile Sensor With Embedded Multiple Capacitors", In Journal of Microelectromechanical Systems, vol. 17, No. 4, Aug. 2008, pp. 934-942.
Lee, H.K., et al., "A Flexible Polymer Tactile Sensor: Fabrication and Modular Expandability for Large Area Deployment", In Journal of Microelectromechanical Systems, vol. 15, No. 6, Dec. 2006, pp. 1681-1686.
Li, S., et al., "Polydimethylsioxane Fluidic Interconnects for Microfluidic Systems", In IEEE Transactions on Advanced Packaging, vol. 26, No. 3, Aug. 2003, pp. 242-247.
Liu, C., "Recent Developments in Polymer MEMS", In Advanced Materials, vol. 19, No. 22, Nov. 2007, pp. 3783-3790.
Liu, M., et al., "Thickness-dependent mechanical properties of polydimethylsiloxane membranes", In Journal of Micromechanics and Microengineering, vol. 19, No. 3, Mar. 2009, pp. 1-4.
Lotters, J.C., et al., "The Mechanical Properties of the Rubber Elastic Polymer Polydimethylsiloxane for Sensor Applications", In Journal of Micromechanical Microengineering, vol. 7, No. 3, Sep. 1997, pp. 145-147.
Maheshwari, V., et al., "Tactile Devices to Sense Touch on a Par with a Human Finger", In Angewandte Chemie International Edition, vol. 47, No. 41, Sep. 2008, pp. 7808-7826.
Majidi, C., et al., "A non-differential elastomer curvature sensor for softer-than-skin electronics", In Smart Materials and Structures, vol. 20, No. 10, Oct. 2011, pp. 1-7.
Micolich, A.P., et al., "An improved process for fabricating high-mobility organic molecular crystal field-effect transistors", In Joural of Applied Physics, vol. 102, Oct. 2007, pp. 1-18.
Muhammad, H.B., et al., "A capacitive tactile sensor array for surface texture discrimination", In Microelectronic Engineering, vol. 88, Aug. 2011, pp. 1811-1813.
Schneider, F., et al., "Mechanical properties of silicones for MEMS", In Journal of Micromechanics and Microengineering, vol. 18, No. 6, Jun. 2008, pp. 1-9.
Schulze, D., et al., "Electrically Induced Instabilities of Liquid Metal Free Surfaces", In Proceedings of Modelling for Material Processing (MMP '06), Riga, LV, Jun. 8-9, 2006, pp. 2501-2511.
Sergio, M., et al., "A textile-based capacitive pressure sensor", In Sensor Letters, vol. 2, No. 2, Jun. 2004, pp. 153-160.
Sergio, M., et al., "A textile based capacitive pressure sensor", In Proceedings of IEEE Sensors 2002, Orlando, FL, Jun. 12-14, 2002, vol. 2, pp. 1625-1630.
Surmann, P., et al., "Voltammetric analysis using a self-renewable non-mercury electrode", In Analytical Bioanalytical Chemistry, vol. 383, No. 6, Oct. 15, 2005, pp. 1009-1013.
Tseng, W-Y., et al., "A slow-adapting microfluidic-based tactile sensor", In Journal of Micromechanics and Microengineering, vol. 19, No. 8., Aug. 2009, pp. 1-8.
Wettels, N., et al., "Biomimetic Tactile Sensor Array", In Advanced Robotics, vol. 22, No. 8, Aug. 2008, pp. 829-849.
Wettels, N., et al., "Deformable skin design to enhance response of a biomimetic tactile sensor", In Proceedings of the 2nd Biennial IEEE/RAS-EMBS International Conference on Biomedical Robotics and Biomechatronics (BioRob '08), Scottsdale, AZ, Oct. 19-22, 2008, pp. 132-137.
Yousef, H., et al., "Tactile Sensing for Dexterous In-Hand Manipulation in Robotics—A Review", In Sensors and Actuators A, vol. 167, No. 2, Jun. 2011, pp. 171-187.
Zhang, G.P., et al., "Fatigue of Small-Scale Metal Materials: From Micro- to Nano-Scale", In Multiscale Fatigue Crack Initiation and Propagation of Engineering Materials: Structural Integrity and Microstructural Worthiness, Jun. 2008, pp. 275-326.

* cited by examiner

SYSTEMS FOR PROVIDING ELECTRO-MECHANICAL SENSORS

CROSS REFERENCE TO RELATED APPLICATION

This application claims the benefit of U.S. Provisional Patent Application No. 61/591,881, filed Jan. 28, 2012, which is hereby incorporated by reference herein in its entirety.

TECHNICAL FIELD

Systems for providing electro-mechanical sensors are provided.

BACKGROUND

Electro-mechanical sensors are devices for converting mechanical stimulus into electrical signals so that the stimulus can be detected or measured. An example of an electro-mechanical sensor is a capacitive sensor. A capacitive sensor typically includes a pair of opposing plates whose capacitance increases as the distance between the opposing plates decreases, or the permittivity of a dielectric medium between the plates increases, due to mechanical stimulus. Capacitive sensors offer advantages such as high sensitivity, tunable spatial resolution when used in an array configuration, and a simple, well-known governing equation.

One application of electro-mechanical sensors is tactile sensing. Tactile sensing is a field of great interest due to its potential impact in robotic sensing applications such as robot-assisted surgery and robotic grasp and manipulation, among other applications. In many cases, visual feedback and acoustic feedback alone do not provide the information necessary for decision making in robotic sensing applications. A classic case is that of an amputee who accidentally crushes or drops an object with his prosthetic hand due to inadequate tactile information about the hand-object interaction.

A difficulty in implementing tactile sensors in robotic applications is that robotic applications often require robust tactile sensing capabilities on curved surfaces, such as artificial fingertips. Such sensing capabilities can be difficult to implement with existing electro-mechanical sensors.

Accordingly, it is desirable to provide new electro-mechanical sensors.

SUMMARY

Systems for providing electro-mechanical sensors are provided. In accordance with some embodiments, systems for providing electro-mechanical sensors are provided, the systems comprising: a flexible material forming at least a first channel and a second channel, wherein the first channel includes a first plate region and the second channel forms a second plate region that is substantially aligned with the first plate region; and an electrically conductive fluid that fills the first channel and the second channel.

In some embodiments, systems for providing an electro-mechanical sensor are provided, the systems comprising: a means for forming a flexible material with at least a first channel and a second channel, wherein the first channel includes a first plate region and the second channel forms a second plate region that is substantially aligned with the first plate region; and a means for filling the first channel and the second channel with an electrically conductive fluid.

DETAILED DESCRIPTION

Systems for providing electro-mechanical sensors are provided. In accordance with some embodiments, capacitive electro-mechanical sensors are provided. In some embodiments, these capacitive electro-mechanical sensors can be used as tactile sensors. In some embodiments, these tactile sensors can be used for robotic tactile sensing applications.

For example, in accordance with some embodiments, a flexible and multilayer capacitive microfluidic normal force sensor with a 5×5 tactile sensor element ("taxel") array can be provided. The sensor can use microfluidic channels filled with an electrically conductive fluid as capacitive plates and conductive interconnects. The sensor can be microfabricated using soft lithography microfabrication techniques and can include multiple layers of polydimethylsiloxane (PDMS) microchannels filled with an electrically conductive fluid, such as Galinstan (for example) and air pockets that modify the mechanical and electrical properties of the sensor. Galinstan is a fairly conductive fluid created by Geratherm Medical AG of Geschwenda, Germany for use in thermometers as a nontoxic substitute for mercury. Galinstan is a eutectic metal alloy composed of gallium, indium, and tin.

In accordance with some embodiments, such a flexible tactile sensor can be conformally wrapped around curved digits of a robotic hand for tactile sensing and can enhance grip by cushioning impacts and increasing the effective contact area during grasp.

A single taxel of such a sensor can be calibrated for normal forces ranging from 0-2.5 N in accordance with some embodiments. The sensor can have a spatial resolution on the order of 0.5 mm and perform reliably even when wrapped around a curved surface. The deformable liquid capacitive plates and heterogeneous PDMS-air dielectric medium can be designed to tune the sensor's sensitivity and range.

Figure 1:
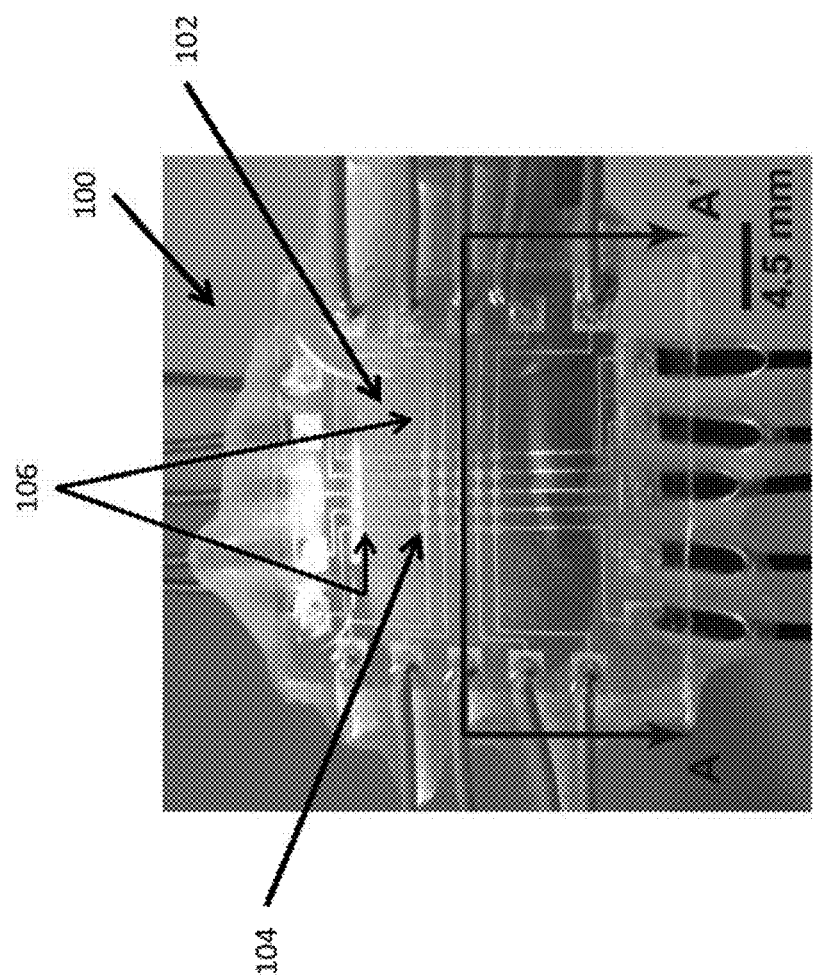
FIG. 1 is a top view of an electro-mechanical sensor in accordance with some embodiments.

Turning to FIG. 1, an example of a capacitive, microfluidic sensor 100 in accordance with some embodiments is shown. As illustrated, sensor 100 can be flexible enough to conform to the curvature of a human finger. In some embodiments, the sensor can be fabricated using soft lithography and include a flexible elastomer 102 to mimic the mechanical properties of human skin and an electrically conductive fluid to serve as flexible plates 104 and interconnects 106 for the capacitive sensing units.

Figure 2:
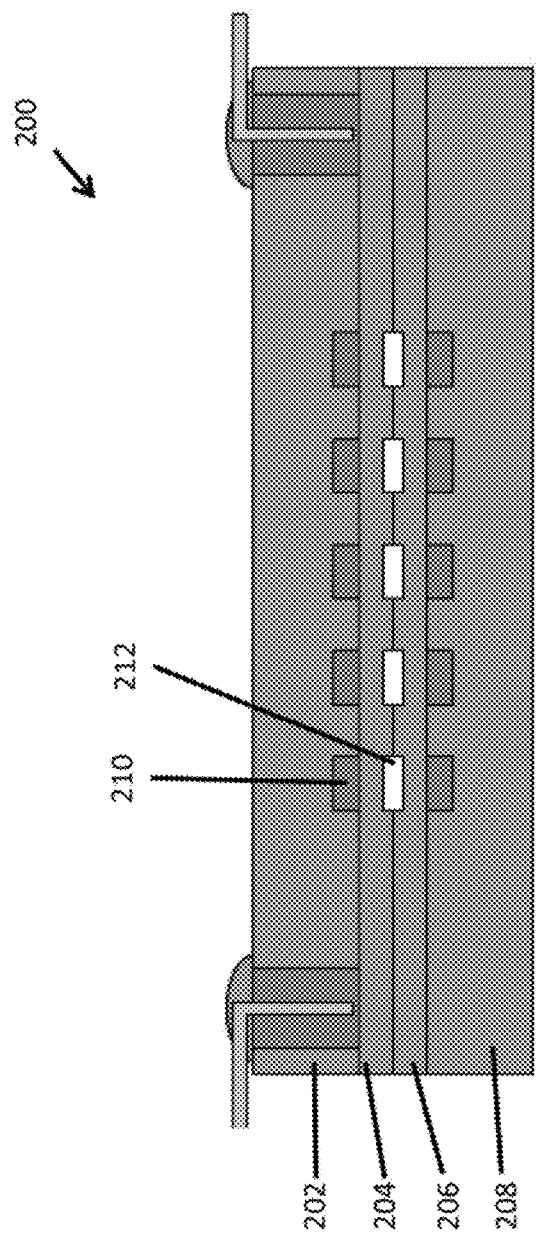
FIG. 2 is a cross-section view of an electro-mechanical sensor showing layers of the sensor in accordance with some embodiments.

As shown in cross-section in FIG. 2, a sensor 200 in accordance with some embodiments can include four layers of PDMS 202, 204, 206, and 208. The two outermost PDMS layers 202 and 208 can contain microfluidic channels 210 filled with Galinstan and the two inner layers 204 and 206 can seal the microfluidic layers and together form an array of square pockets 212 to time the overall sensor's mechanical and electrical properties. Pockets 212 can be filled with any suitable gas (such as air), solid, gel, etc., or can contain a vacuum, in some embodiments.

Figure 3:
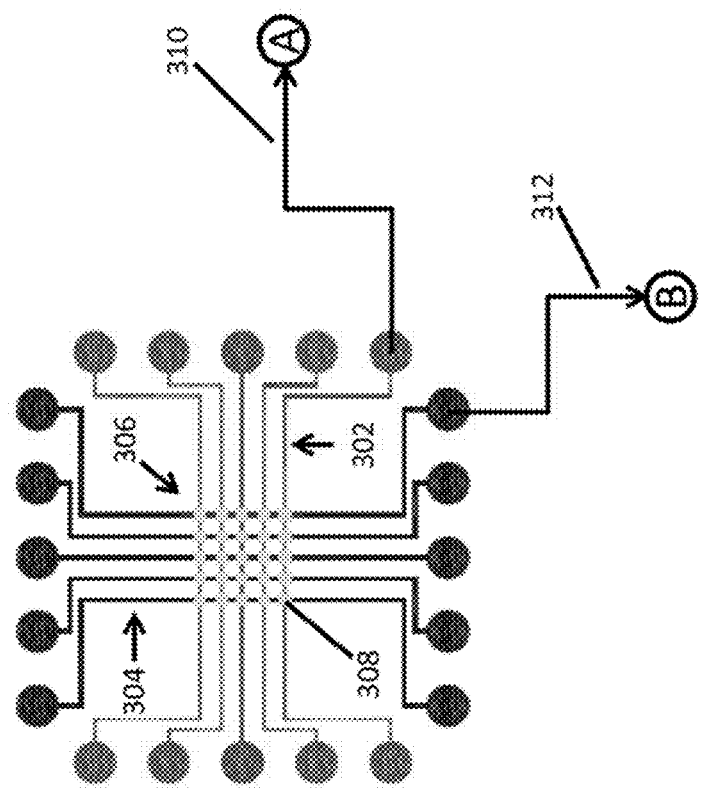
FIG. 3 is a top view of a layout of an electro-mechanical sensor in accordance with some embodiments.

As shown in FIG. 3, microfluidic channels 302 and 304 can form a 5×5 array 306 of taxels 308 connected by in-plane paths formed by channels 302 and 304 (lengthways paths formed by channels 302 can be in the top layer and transverse paths formed by channels 304 can be in the bottom layer). The paths formed by channels 302 and 304 can have any suitable dimensions. For example, in some embodiments, the paths can be 125 μm thick. As shown, each of these paths can pass through and connect five 0.5 mm×0.5 mm (or any other suitable size) taxel plates, each of which can be separated from the next plate by 0.5 mm (or any other suitable spacing).

In some embodiments, as shown in FIG. 2, a 5×5 array of square air pockets 212 formed by layers 204 and 206 can have the same layout and dimensions as 5×5 array of plates 306 in the microfluidic channel layers 202 and 208.

An example of a process for making a sensor in accordance with some embodiments is now illustrated in connection with FIGS. 4-8.

Figure 4:
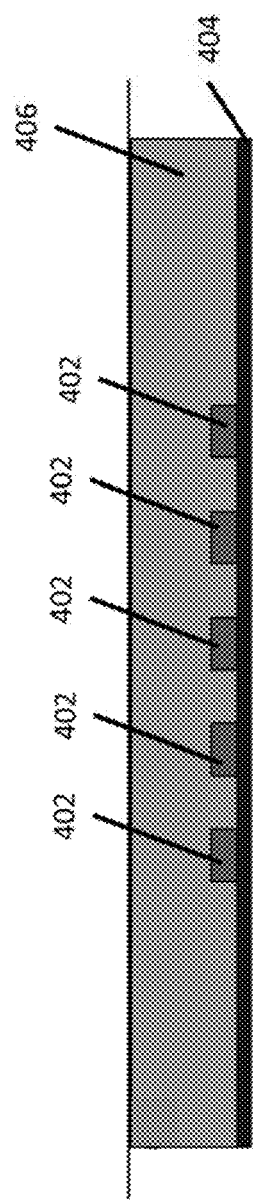
FIG. 4 is a cross-section view of an outer layer of an electro-mechanical sensor in accordance with some embodiments.
Figure 6:
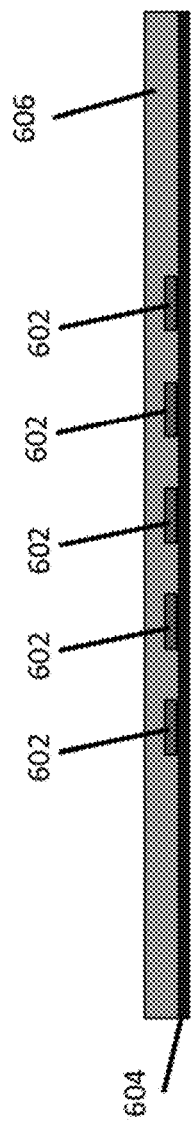
FIG. 6 is a cross-section view of an inner layer of an electro-mechanical sensor in accordance with some embodiments.

In some embodiments, PDMS masters for layers 202, 204, 206, and 208 can be made as follows. PDMS masters for the microfluidic layers 202 and 208 can be fabricated by patterning 40 μm of SU-8 2015 photoresist 402 (available from Microchem of Newton, MA) onto 4" silicon wafers 404 as shown in FIG. 4. PDMS masters for the air pocket layers 204 and 206 can be fabricated by patterning of 18 μm thick SU-8 2010 photoresist 602 onto 4" silicon wafers 604 as shown in FIG. 6. These masters can be soft baked at 95 degrees Celsius for five minutes and then exposed to 22.5 mW/cm$^2$ UV light for 16 seconds using mylar masks. After a five minute post-exposure bake on a hot plate at 95 degrees Celsius, the wafer can be developed and then hard baked in an oven at 140 degrees Celsius for five minutes. The thicknesses of the masters can be measured using a profilometer (e.g., a Dektak IIA available from Sloan of Scotia, N.Y.).

Once the masters are complete, layers 202, 204, 206, and 208 can be manufactured as follows. As described above, in some embodiments, these layers can be made from PDMS, and any suitable PDMS composition and curing process can be used. For example, in some embodiments, PDMS with a 10:1 A:B ratio (e.g., RTV615 available from Momentive of Columbus, Ohio) can be used.

Each of the two 300 μm thick microfluidic channel layers 202 and 208 can be fabricated by (1) spin coating PDMS onto the microfluidic channel mold at 500 rpm for 30 seconds and curing it in an oven at 80 degrees Celsius for an hour to produce a 150 μm thick layer, and then (2) repeating this process a second time to produce 300 μm thick PDMS films 406. The resulting layer can appear as shown in FIG. 4.

Next, PDMS layer 406 can be removed from wafer 404. Any suitable technique for removing the layer can be used in some embodiments. For example, PDMS layer 406 can be removed from wafer 404 by careful peeling the layer from the wafer by gloved hands in some embodiments.

Figure 5:
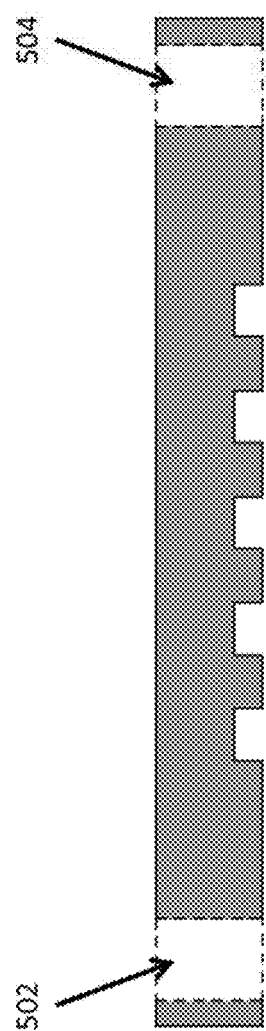
FIG. 5 is a cross-section view of an outer layer of an electro-mechanical sensor with holes punched in the layer in accordance with some embodiments.

As shown in FIG. 5, the two ends 502 and 504 of each wire-plate path in layers 202 and 208 can next be punched with a 700 μm diameter stainless steel TiN-coated round punch (available from Technical Innovations of Angleton, Tex.) to create through-holes that serve as inlets and outlets for the injection of Galinstan. Although an outlet is shown in FIG. 5 and described herein, in some embodiments, the outlet can be omitted.

The 25 μm thick air pocket layers 204 and 206 can be created by spinning PDMS 606 onto the corresponding master at 3000 rpm for 30 seconds and curing it in an oven at 80 degrees Celsius for an hour. The resulting layer can appear as shown in FIG. 6.

Figure 7:
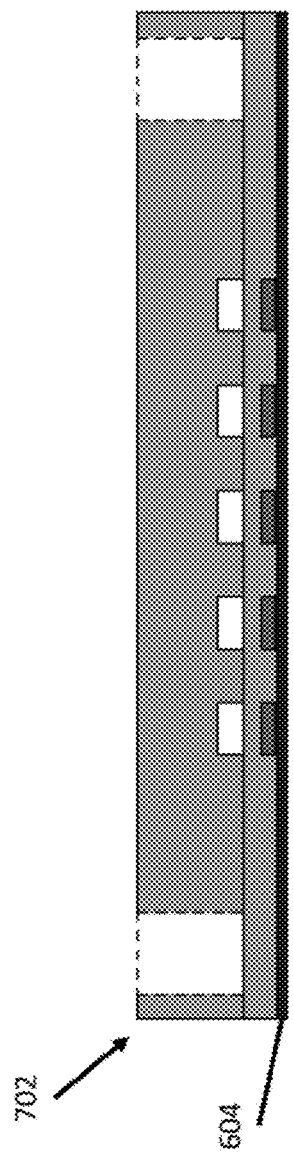
FIG. 7 is a cross-section view of a combination of an outer layer and an inner layer of electro-mechanical sensor in accordance with some embodiments.

Next, as shown in FIG. 7, microfluidic channel layers 202 and 208 can be bound to an air pocket layer 204 and 206, respectively, after oxygen plasma treatment (using, for example, PDC-001, available from Harrick Plasma of Ithaca, N.Y.). In some embodiments, during binding, isopropanol (IPA) can be used to wet each of layers 202 and 204 (or 206 and 208) and these layers can be aligned under a microscope to ensure accurate alignment of the 5×5 arrays of taxel plates and air gaps. Each of the two-layer sandwiches 702 (i.e., formed from layers 202 and 204, or layers 206 and 208) can then be placed on a hot plate at 80 degrees Celsius for one hour.

Next, two-layer sandwiches 702 can be removed from wafer 604. Any suitable technique for removing sandwiches 702 can be used in some embodiments. For example, two-layer sandwiches 702 can be removed from wafer 604 by careful peeling the sandwiches from the wafer by gloved hands in some embodiments.

Figure 8:
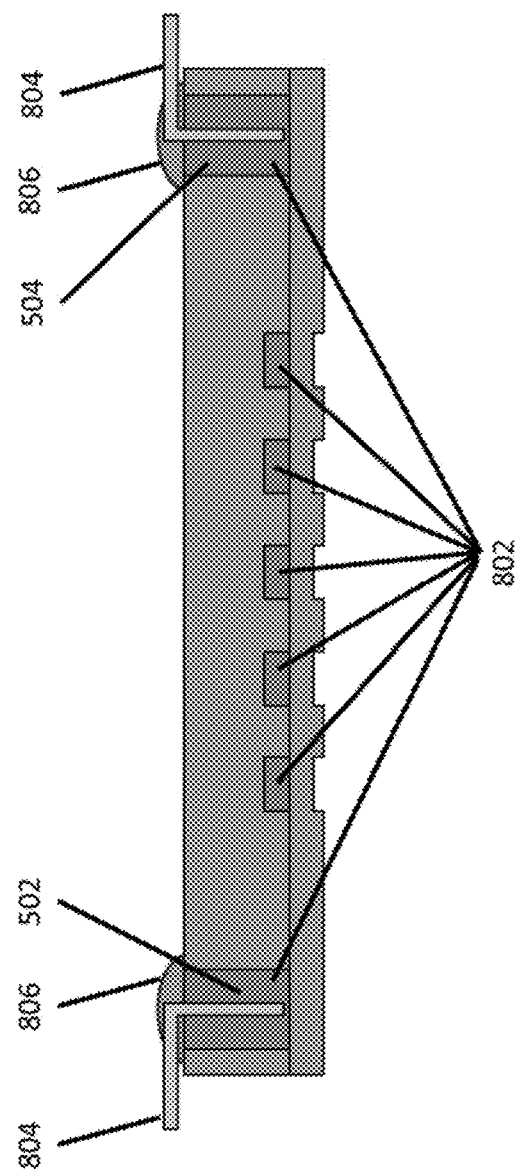
FIG. 8 is a cross-section view of a combination of an outer layer and an inner layer of electro-mechanical sensor with Galinstan inserted into the combination in accordance with some embodiments.

As shown in FIG. 8, Galinstan 802 can then be injected into each arm of the five paths in each of the layers 202 and 208 using a syringe with a 700 μm diameter stainless steel tube attached. Next, rigid, insulated 500 μm diameter (or any other suitable diameter) wires 804 can be positioned in the inlet and outlet holes 502 and 504 and uncured PDMS 806 can be poured over the holes. The system can be placed in an oven for 2 hours at 80 degrees Celsius to cure the PDMS applied to the channels' inlet and outlet holes.

In some embodiments, electrical continuity and resistance of 1.5-2.5Ω between the inlet and outlet of each path can be verified with a multimeter.

Finally, an $O_2$ plasma-IPA alignment and bonding technique can be used to position and bond the two halves of the sensor perpendicular to one another in order to obtain a functional sensor as shown in FIG. 2. Note that for clarity, the wires at the end of the paths of the bottom layer of Galinstan-filled channels are not shown in FIG. 2.

Figure 9:
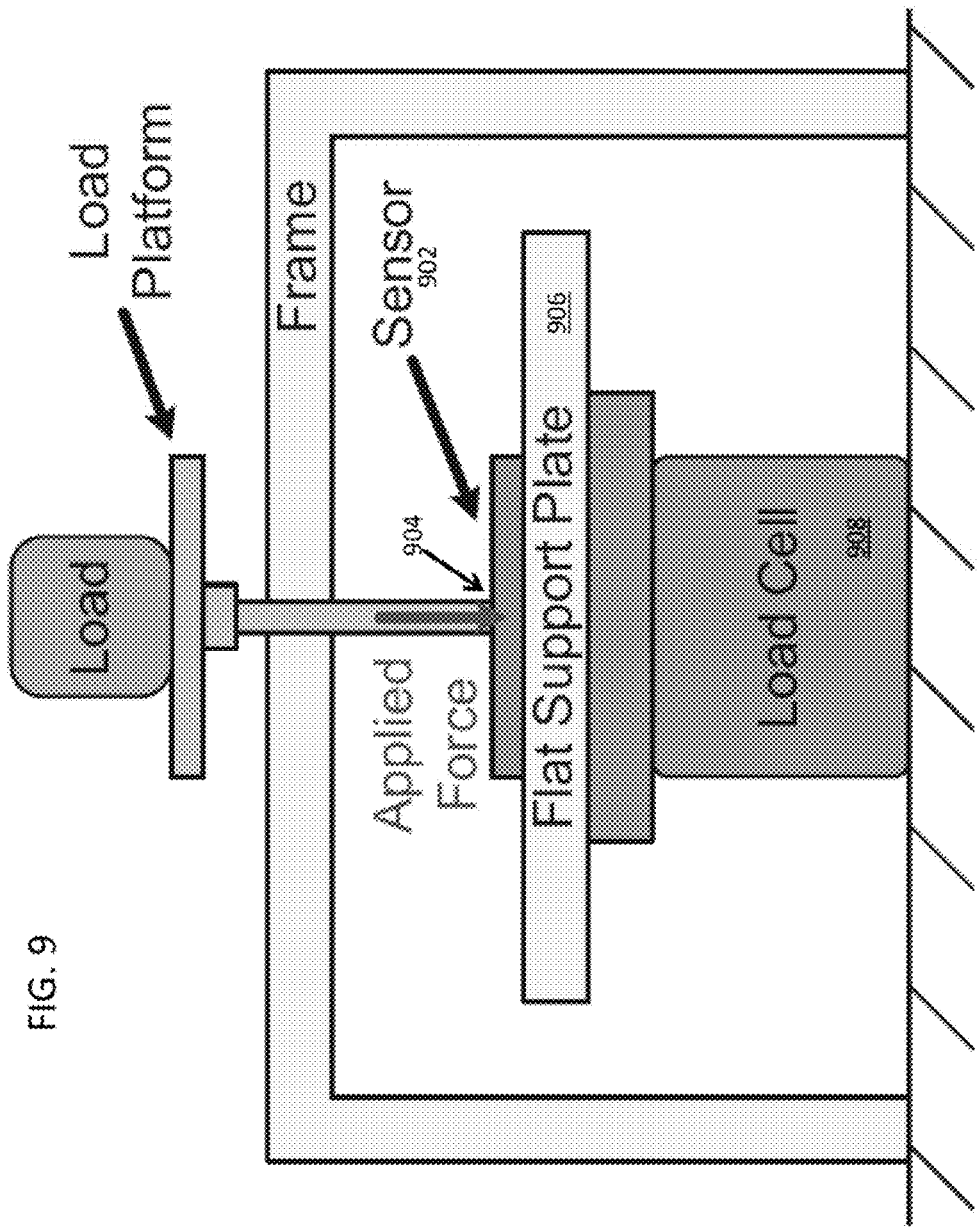
FIG. 9 is diagram of a mechanism for testing and/or calibrating an electro-mechanical sensor in accordance with some embodiments.

As shown in FIG. 9, in some embodiments, in order to test and calibrate a sensor 902, a single taxel of the sensor can be loaded by a uniaxial, point-load using a 1.5 mm×1.5 mm rectangular-shaped tip 904. Double-sided sticky mylar tape can be used to affix sensor 902 to a rigid, flat support plate 906 affixed to a six degree-of-freedom force/torque transducer (e.g., Nano-17 available from ATI Industrial Automation of Apex, N.C.) 908 having resolutions of 1/80 N and 1/16 N-mm for force and torque, respectively.

In some embodiments, testing and calibration of the sensor can be performed with the sensor and its electrical circuit inside a Faraday cage for shielding from external electromagnetic noise. For example, in some embodiments, an electromagnetic noise shielding film (e.g., such as films available from Tatsuta System Electronics Co., Ltd. of Osaka, Japan) can be used for testing and/or production use. In some embodiments, a metallic deposition layer of such a film can be connected to a common ground of a tactile sensor skin circuit using any suitable mechanism, such as a conductive adhesive.

In some embodiments, sensor data can be collected with the sensor at rest in an unloaded state. The tip of the load platform can then be carefully centered over a single taxel with no overlap of adjacent taxel units. Calibrated masses can then be added to the load platform to gradually achieve a total of 250 g (2.45 N). The actual transmitted load can be determined by the force transducer. The masses and load platform can be removed in reverse order (and with different load increments) until the sensor is completely unloaded. The sensor can be allowed to equilibrate after each change in external load before data are collected for a 0.1 sec interval.

In some embodiments, low frequency dynamic loads can be applied to the sensor as in FIG. 9 with a load that is raised and lowered against the load platform. In some embodiments, the sensor can follow the loading and unloading phases of the dynamic stimulus with no significant lag.

Figure 10:
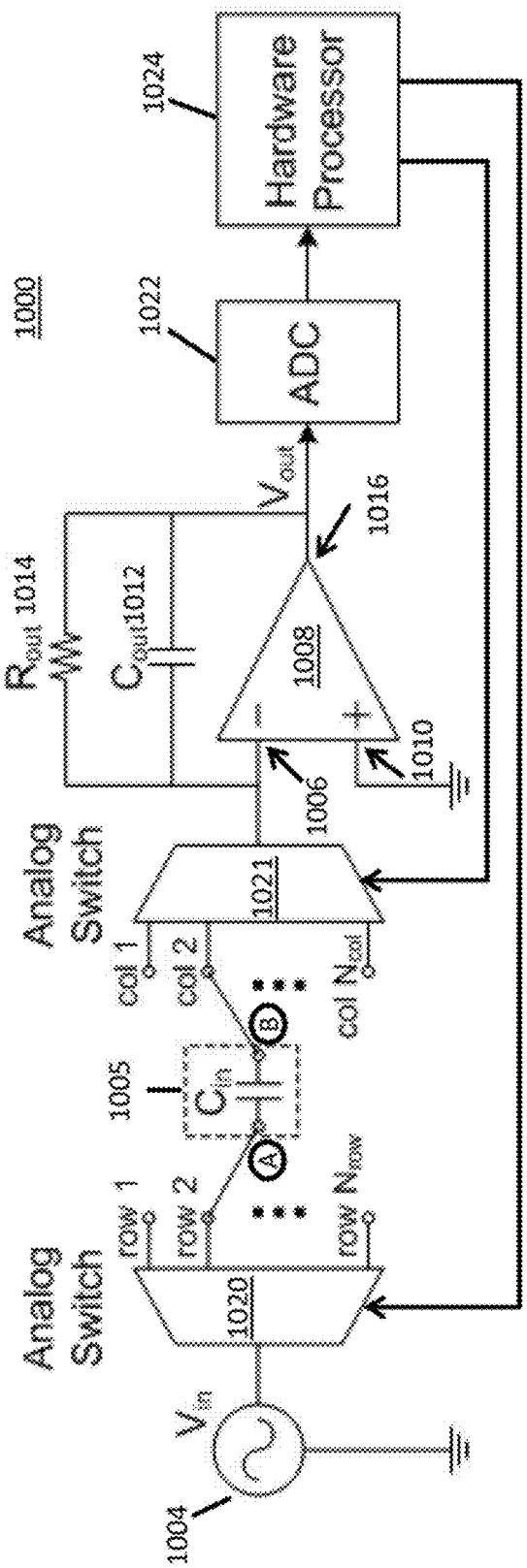
FIG. 10 is a schematic diagram of circuitry for receiving, amplifying, and processing a signal from a sensor in accordance with some embodiments.

In some embodiments, any suitable circuit can be used to measure the capacitance of individual taxels. For example, as illustrated in circuit 1000 of FIG. 10, in some embodiments, a charge amplifier circuit can be used to detect the capacitance value of a first taxel (illustrated as $C_{in}$ 1005) and provide a corresponding output voltage. This output voltage can then be converted to digital form by an analog-to-digital converter 1022, and processed by a hardware processor 1024. The detected taxel can be switched by a pair of analog switches (or analog multiplexers) 1020 and 1021 under the control of hardware processor 1024. Within or after hardware processor 1024, the digitized sensor signal (or any signals based on this signal) can be used for any suitable purpose, such as detecting force or pressure on a robotic finger. Components 1020, 1022, and 1024 can be combined and/or replaced with any other suitable components in some embodiments.

More particularly, in some embodiments, the charge amplifier circuit of circuit 1000 can be implemented as follows. As illustrated, an AC input signal 1004 can be applied to a first side of an analog switch 1020. A second side of switch 1020 can be coupled to a plurality of rows of taxel plates. For example, these rows of taxel plates can be on a top layer of a sensor. One side of a taxel 1005 (e.g., the top side) can be coupled to second row of taxel plates, and therefore to a row 2 connection on the second side of switch 1020. The other side of taxel 1005 (e.g., the bottom side) can be coupled to a second column of taxel plates, and therefore to a column 2 connection on a first side of an analog switch 1021. Other columns of taxel plates can be coupled to other connections on the first side of switch 1021. A second side of switch 1021 can then be coupled to an inverting input 1006 of an operational amplifier 1008.

A non-inverting input 1010 of operational amplifier 1008 can be connected to ground. An external feedback capacitor 1012 and a resistor 1014 can be connected across the operational amplifier's inverting input 1006 and output 1016. While the AC input voltage remains constant, changes in taxel capacitance produce changes in charge, which translates to changes in the operational amplifier's output voltage amplitude. Thus, the gain in amplitude of the AC input signal depends on the ratio of capacitance between the constant external capacitor and the variable capacitive taxel.

In some embodiments, under the assumption of an ideal operational amplifier, nodal analysis can be performed on the charge amplifier circuit to obtain:

$$V_{out} = -V_{in}\left(\frac{j\omega R_{out}C_{in}}{j\omega R_{out}C_{out} + 1}\right), \quad (1)$$

where $V_{out}$ is the output voltage amplitude of the operational amplifier, $V_{in}$ is the input voltage amplitude, $\omega$ is the excitation frequency of the input signal, $R_{out}$ is the external feedback resistance, $C_{in}$ is the capacitance of a single taxel (connected to the operational amplifier's inverting input), and $C_{out}$ is the external feedback capacitance. If $\omega R_{out}C_{out} \gg 1$, then equation (1) simplifies to:

$$V_{out} = -V_{in}\left(\frac{C_{in}}{C_{out}}\right). \quad (2)$$

By setting the input signal frequency $\omega$ to 62832 rad/s, $R_{out}$ to 200 MΩ, and $C_{out}$ to 1 pF, the expression $\omega R_{out}C_{out}$ has a value of 12.566 and allows the use of equation (2). In response to mechanical deformation under load, changes in taxel capacitance $C_{in}$ can be measured through changes in output voltage amplitude $V_{out}$.

In some embodiments, data acquisition boards (e.g., NI-6255 and NI-6211 available from National Instruments, Austin, Tex.) can be used to collect data from the load cell at 1 kHz and a single sensor taxel at 200 kHz. The amplifier circuit input signal can be sinusoidal with a peak-to-peak voltage of 1.0 V and a frequency of 10 kHz. Sensor taxel data can be collected at 20 times the input signal frequency in order to obtain accurate amplitudes from the output signal.

Post-processing of the raw load cell and capacitive sensor signals can be performed in Matlab (available from Mathworks of Natick, Mass.). The amplitude of the capacitive sensor output voltage can be determined for each cycle (using the maximum and minimum value for each wave). The mean load cell readings and mean taxel output amplitudes can be computed for each 0.1 sec interval of data. Assuming constant $V_{in}$ and $C_{out}$ values, the changes in taxel capacitance $C_{in}$ can be directly reflected by changes in output voltage amplitude $V_{out}$ using equation (2). The relative percent change in output voltage amplitude, $\% \Delta V$, can be calculated as:

$$\% \Delta V = \frac{V_{out,loaded} - V_{out,unloaded}}{V_{out,unloaded}} * 100\%, \quad (3)$$

where the output voltage amplitude $V_{out}$ is a function of load.

In some embodiments, a power-law curve can be fit to the force values as a function of the calculated $\% \Delta V$ using nonlinear regression analysis. For example, in some embodiments, the final regression model can be given by:

$$F_{fit} = 0.0455(\% \Delta V)^{1.73} - 0.00976(\% \Delta V)^{2.14}, R^2 = 0.982, \quad (4)$$

where $F_{fit}$ is the force calculated by the curve fit.

Figure 11:
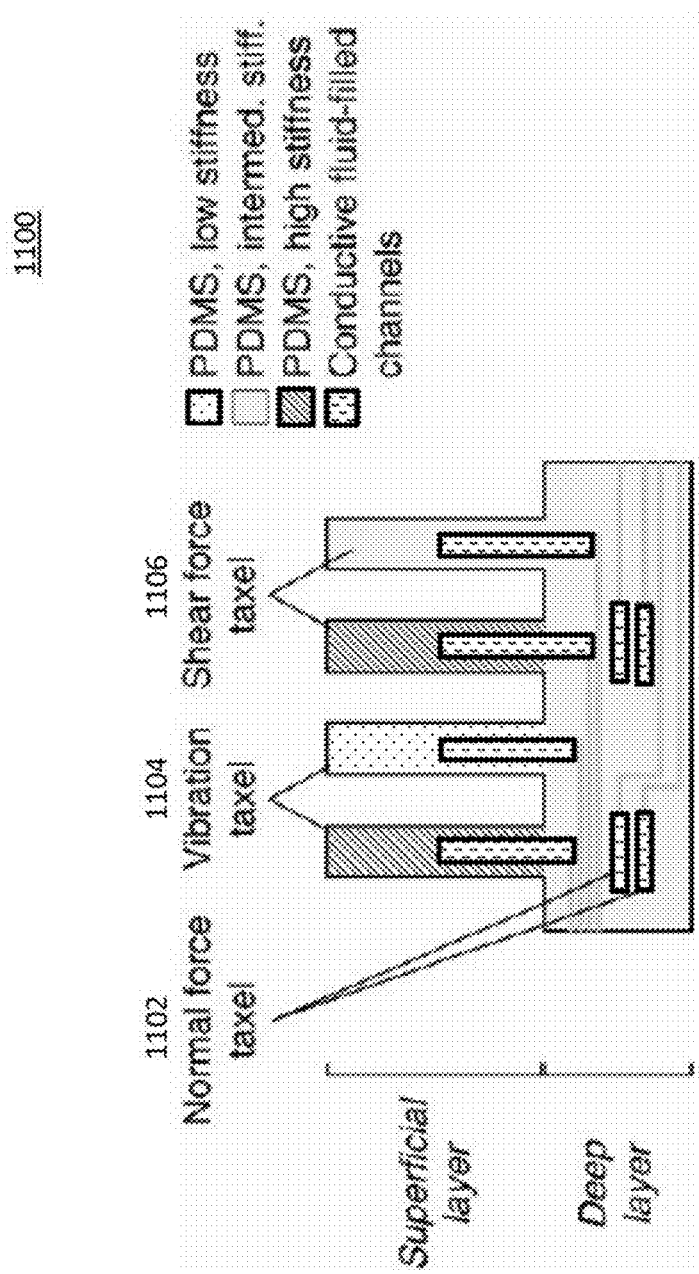
FIG. 11 is a cross section view of a sensor system in accordance with some embodiments.

In addition to being implemented as normal force tactile sensors as illustrated above, in some embodiments, the capacitive electro-mechanical sensors described herein can additionally or alternatively be implemented as other types of sensors. For example, as illustrated in FIG. 11, a sensor system can include a normal force tactile sensor (e.g., like illustrated above), a vibration sensor 1104, and a shear force sensor 1106. Like sensor 1102, sensors 1104 and 1106 can be implemented using channels formed in PDMS that are filled with an electrically conductive fluid, such as Galinstan. As illustrated in FIG. 11, the PDMS can have different stiffnesses in different areas in order to facilitate detecting vibration and shear forces. As with the pairs of plates in sensor 1102, the pairs of plates in sensors 1104 and 1106 can be coupled to a charge amplifier circuit (such as that illustrated in FIG. 10) and the signals processed to detect any suitable mechanical stimulus on sensor system 1100.

Figure 12A:
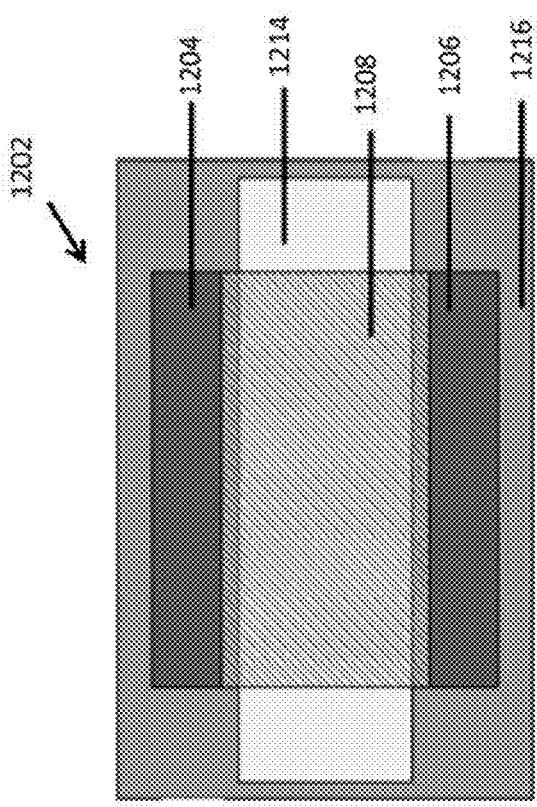
FIGS. 12A and 12B are cross section views of another sensor system in accordance with some embodiments.
Figure 12B:
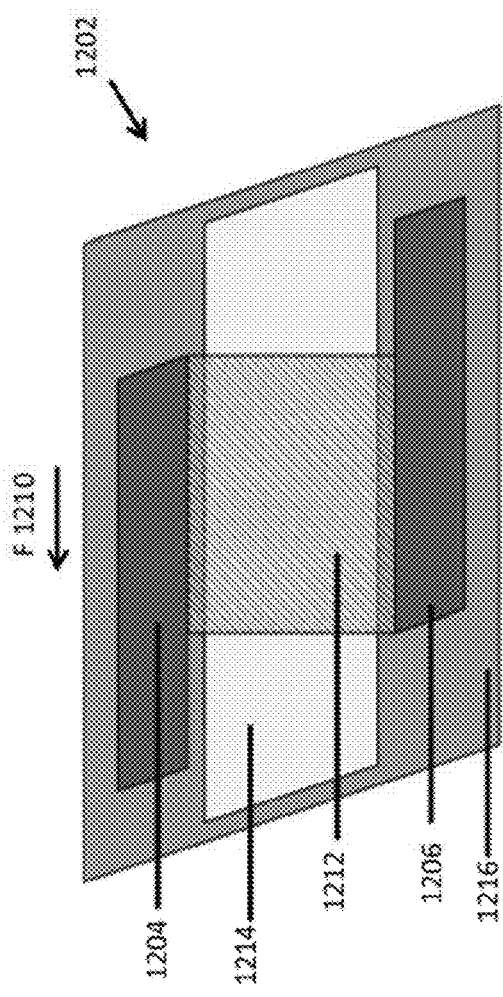

Turning to FIGS. 12A and 12B, another example of a shear force sensor 1202 that can be used in some embodiments is shown. As illustrated in FIG. 12A, when sensor 1202 is not under shear force, the top plate 1204 and the bottom plate 1206 of the sensor can be substantially aligned as shown by region 1208. As illustrated in FIG. 12B, however, when a shear force 1210 is applied to the sensor, the alignment of plates 1204 and 1206 changes, as shown by region 1212, resulting in a change in capacitance of the sensor. In some embodiments, FIG. 12A could illustrate the sensor when force is applied and FIG. 12B could illustrate the sensor when the force is removed. Reference numerals 1214 and 1216 illustrate the air pocket and the PDMS, respectively, that can be used in the sensor in some embodiments.

Figure 13:
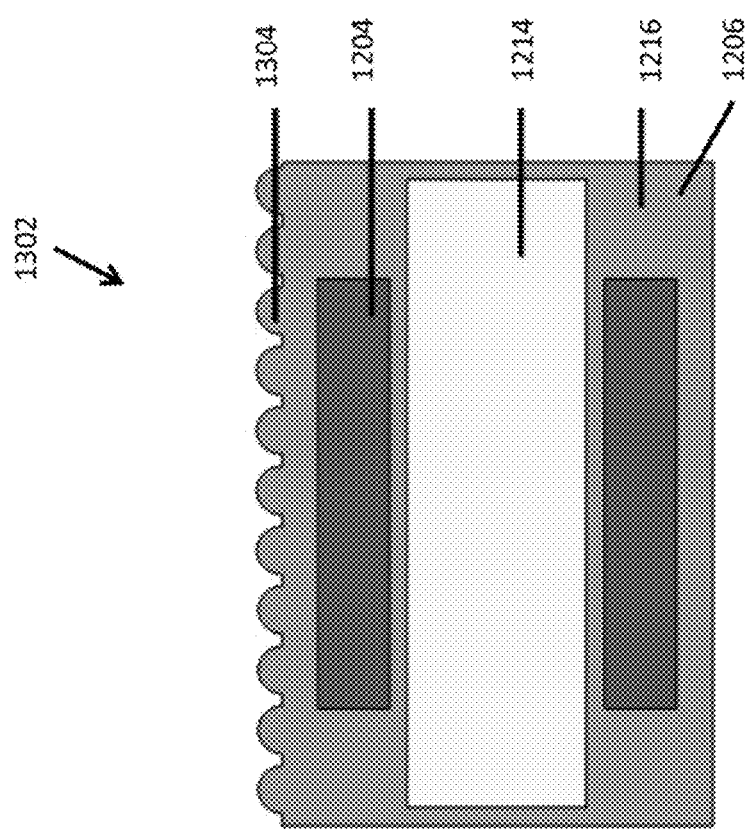
FIG. 13 is a cross section view of yet another sensor system in accordance with some embodiments.

FIG. 13 illustrates yet another example of a shear force sensor 1302 that can be used in some embodiments. As shown, this sensor can include a rough surface 1304 that can be used to improve the friction between the sensor and a surface (not shown) applying a shear force to the sensor.

In some embodiments, the sensor's multilayer design can enable nonlinear tuning of the sensitivity over a wide range of forces which can be used to tailor the sensor response to the application of interest. The multilayer design utilizing PDMS and air sub-layers can allow for the tuning of mechanical and electrical properties, particularly for the heterogeneous, deformable dielectric medium in some embodiments.

Although the invention has been described and illustrated in the foregoing illustrative embodiments, it is understood that the present disclosure has been made only by way of example, and that numerous changes in the details of implementation of the invention can be made without departing from the spirit and scope of the invention, which is limited only by the claims which follow. Features of the disclosed embodiments can be combined and rearranged in various ways.

What is claimed is:

1. A system for providing an electro-mechanical sensor comprising:
    a flexible material forming at least a first channel and a second channel, wherein the first channel includes a first plate region and the second channel forms a second plate region that is substantially aligned with the first plate region;
    an electrically conductive fluid that fills the first channel, including the first plate region, and the second channel, including the second plate region; and
    wherein the combination of the first channel with the second channel form a taxel.

2. The system of claim 1, wherein the first plate region and the second plate region are arranged so that the first plate region and the second plate region move relative to one another when a force is applied to the flexible material.

3. The system of claim 1, wherein the flexible material forms a compressible region between the first plate region and the second plate region.

4. The system of claim 3, wherein the compressible region is filled with a softer substance than the flexible material.

5. The system of claim 4, wherein the softer substance is air.

6. The system of claim 1, further comprising a circuit that is responsive to a capacitance formed by the first plate region and the second plate region.

7. The system of claim 6, wherein the circuit determines an output voltage corresponding to the capacitance formed by the first plate region and the second plate region.

8. The system of claim 7, wherein the output voltage is converted to a digital signal by an analog-to-digital-converter.

9. The system of claim 1, wherein the electrically conductive fluid is Galinstan.

10. The system of claim 1, wherein the flexible material is polydimethylsiloxane.

11. A system for providing an electro-mechanical sensor comprising:
    a means for forming a flexible material with at least a first channel and a second channel, wherein the first channel includes a first plate region and the second channel forms a second plate region that is substantially aligned with the first plate region;
    a means for filling the first channel, including the first plate region, and the second channel with an electrically conductive fluid, including the second plate region; and
    wherein the combination of the first channel with the second channel form a taxel.

12. The system of claim 11, wherein the first plate region and the second plate region are arranged so that the first plate region and the second plate region become closer when a force is applied to the flexible material.

13. The system of claim 11 wherein the means for forming a flexible material forms a compressible region between the first plate region and the second plate region.

14. The system of claim 13, wherein the compressible region is filled with a softer substance than the flexible material.

15. The system of claim 14, wherein the softer substance is air.

16. The system of claim 11, further comprising a means for generating an output that is responsive to a capacitance formed by the first plate region and the second plate region.

17. The system of claim 16, wherein the means for generating an output determines an output voltage corresponding to the capacitance formed by the first plate region and the second plate region.

18. The system of claim 17, further comprising a means for converting the output voltage to a digital signal.

19. The system of claim 11, wherein the electrically conductive fluid is Galinstan.

20. The system of claim 11, wherein the flexible material is polydimethylsiloxane.

* * * * *